Figure 1:
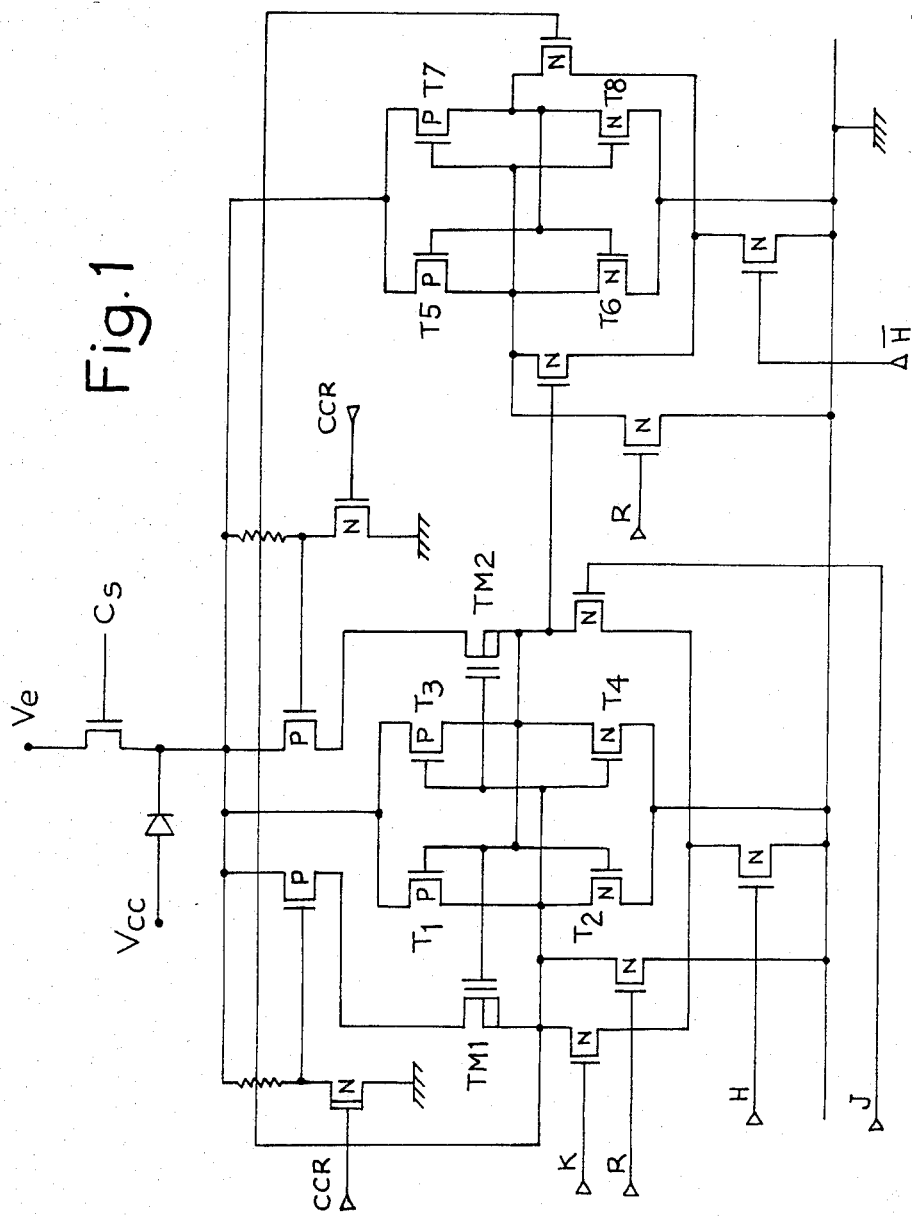

United States Patent [19]

Brice

[11] Patent Number: 4,512,029
[45] Date of Patent: Apr. 16, 1985

[54] NON-VOLATILE DECADE COUNTER USING JOHNSON CODE OR EQUIVALENT

[75] Inventor: Jean-Michel Brice, Grenoble, France

[73] Assignee: Societe pour l'Etude et la Fabrication de Circuits, Grenoble, France

[21] Appl. No.: 428,329

[22] Filed: Sep. 29, 1982

[30] Foreign Application Priority Data

Apr. 20, 1982 [FR] France .................................. 82 06755

[51] Int. Cl.³ ...................... H03K 23/08; H03K 25/00
[52] U.S. Cl. .................................. 377/33; 307/272 A;
307/279; 377/32; 377/109; 377/117; 377/121
[58] Field of Search .................... 307/272 A, 279, 291;
377/15, 26, 32–34, 36, 109, 117, 121

[56] References Cited

U.S. PATENT DOCUMENTS

| | | | |
|---|---|---|---|
| 3,530,284 | 9/1970 | Wood | 377/33 X |
| 3,911,330 | 10/1975 | Fletcher et al. | 377/72 |
| 4,049,951 | 9/1977 | Baty et al. | 377/26 X |
| 4,175,290 | 11/1979 | Harari | 307/279 X |
| 4,224,506 | 9/1980 | Coppola et al. | 377/32 |
| 4,228,346 | 10/1980 | Barker | 377/32 X |

Primary Examiner—Stanley D. Miller
Assistant Examiner—D. R. Hudspeth
Attorney, Agent, or Firm—Oblon, Fisher, Spivak, McClelland & Maier

[57] ABSTRACT

This invention concerns counters.

More specifically, it relates to a non-volatile counting decade, comprising five flipflops, the outputs of which represent the decimal contents of the decade in the Johnson code. In this code, no flipflop changes its state more than twice in the course of a counting cycle from 0 to 10. The state of the counter is safeguarded on every incrementation, in separate safeguard circuits for each flipflop, formed of MNOS or floating-base transistors. However, any flipflop output state is safeguarded only if its state has changed after incrementation, this being detected by a logic circuit, which selects the safeguard signal for each flipflop.

By means of an extremely simple combinative circuit, this invention thereby greatly reduces the number of writing cycles to be performed by the MNOS or floating-base transistors, which cannot withstand an excessive number of writing cycles.

8 Claims, 4 Drawing Figures

NON-VOLATILE DECADE COUNTER USING JOHNSON CODE OR EQUIVALENT

BACKGROUND OF THE INVENTION

This invention concerns an electronic totalizing circuit, more specifically a counter to receive counting pulses, so constructed that the counter contents are stored in a non-volatile memory, so that the contents will not be lost when the electric energy feeding the counter is switched off.

A counter of this kind can be formed of synchronous flipflops, provided with safeguard circuits: under normal operating conditions, these flipflops change status in relation to their input signals, under the control of a clock signal, while a safeguard signal protects the state of the flipflop in a non-volatile way, so that, when power has been cut, the flipflop can be reset in the memorized state, either automatically, or through a resetting signal.

FIG. 1 shows a specimen synchronous bistable flipflop with a safeguard circuit and with controlled resetting. This is a master/slave JK flipflop with two inputs J and K, clock inputs H and H* (where the asterisk indicates a signal complementary to a given signal), a forced clearance input R, and a resetting signal input CCR. The actual flipflop basically comprises four master flipflop transistors $T_1$ to $T_4$, and four slave flipflop transistors $T_5$ to $T_8$. The safeguard circuit basically comprises two MNOS (Metal/Nitride/Oxide/Semiconductor) transistors $TM_1$ and $TM_2$, which provide non-volatile storage for trapped electric charges, that make them either conducting or blocked.

Flipflop states are safeguarded by means of a safeguard control signal $C_S$, which allows a higher writing voltage $V_e$ than the normal operating voltage $V_{cc}$ to be applied to the flipflop; simultaneously, the collectors of the MNOS transistors $TM_1$ and $TM_2$ are isolated from the supply line, by means of a low signal (0 volt), applied to the resetting input CCR. The emitters of $TM_1$ and $TM_2$, connected to the master flipflop outputs, are energized either to 0 volt or to the writing voltage $V_e$, depending on the state of the flipflop.

Transistors $TM_1$ and $TM_2$ adopt a forced permanent conducting or blocked state, which depends directly on the time at which the control signal $C_s$ has been applied.

The flipflop state is also reset by means of the signal CCR in the high state, which connects the MNOS transistors $TM_1$ and $TM_2$ to the supply line, to force the master flipflop into a state connected to the state of blockage or conduction of these transistors. The flipflop then regains the state it possessed at the time of the safeguard operation.

The circuit in FIG. 1 is given only as an example, to illustrate the functioning of a bistable flipflop with a safeguard and resetting circuit. Other flipflops may be used, such as D instead of JK flipflops, or safeguard circuits with floating-base transistors, instead of MNOS transistors, and so on.

For certain counting purposes, it is necessary to store counter contents in a non-volatile memory, at all times, for instance to meter the duration or number of operating cycles of an appliance which functions only intermittently, with the power supply to it (and thus to the counter) switched off after each use. Under these circumstances, a safeguard stage must be included after every incrementation of the counter (in the following description, the word "incrementation" will be used in the widest sense of incrementation or decrementation, since the invention encompasses counters, discounters and reversible counters).

Now, MNOS or floating-base transistors, which are the basic components of safeguard circuits, can withstand only a limited number of writing cycles, after which they gradually deteriorate, and are no longer capable of trapping properly the electric charges which make them conducting or blocked. This results in a reduction in retention of stored data, and also in a risk of wrong resetting, because of changes in transistor blocking threshold voltages after a large number of writing cycles.

The maximum reliable number of cycles would appear to be $10^5$ to $10^6$ for MNOS devices, which rules out applications where the counter has to function for around this number of cycles.

In order to increase the maximum number of incrementations that the counter can accept while safeguarding its contents at every such incrementation, this invention proposes a counting unit comprising a loop of several flipflops, the outputs of which represent the contents of the counting unit in binary form, in a particular code in which no bit changes more than twice in the course of a complete counting cycle of the unit, and further comprising means of activating non-volatile memorization of flipflop output states, and a selection logic circuit connected to these activating means, to prohibit activating memorization of the state of flipflops that have not changed after an incrementation of the counting unit, and to enable activating memorization of the state of flipflops that have changed after such incrementation.

Consequently, instead of a counter constructed in the conventional way, with the flipflops arranged to count normally in pure binary code, or BCD ("binary coded decimal"), commonest for counters required to represent decimal numbers, this invention uses a different code, preferably the "Johnson code", which will be explained below, or a similar code, from the point of view of the reduced number of changes of each bit during a complete counting cycle. In addition, safeguarding at each incrementation is carried out only for flipflops that have changed status.

These two features, the small number of status changes of flipflops, and selection of flipflops whose contents need to be safeguarded after a status change, help to reduce the number of writing cycles performed by each flipflop, and thereby increase the overall useful life of the counter.

The term "counting unit" is used, since a counter may comprise several counting units, each corresponding to figures of different weights in the counting result; e.g. a four-digit decimal counter (0 to 9999) will comprise four cascade-connected counting units, constituting four counting decades. Each such decade has a complete cycle of ten successive incrementations. But it would be possible to have a counter displaying a four-digit hexadecimal result (0000 to FFFF); each counting unit would in this case perform a counting cycle of sixteen incrementations.

Basically, a counting unit, taken individually, should have several outputs (outputs from flipflops of the loop composing this unit), and these outputs should define, in the form of several bits, a one-digit numerical counting result (0 to 9 for a decade in decimal), in accordance with a special binary code in which each bit changes not more than twice during a cycle (0 to 9 in decimal).

The Johnson code is particularly suitable, since it complies with this condition, and, as will be seen below, allows an extremely simple combinative logic circuit to identify, after an incrementation at the counter, and therefore after every counting pulse, the flipflops which have to undergo a writing cycle (two flipflops for each counting pulse), depending on the state of flipflop outputs, and possibly on the existence of a general clearance signal for the counting unit or counter.

Figure 2:
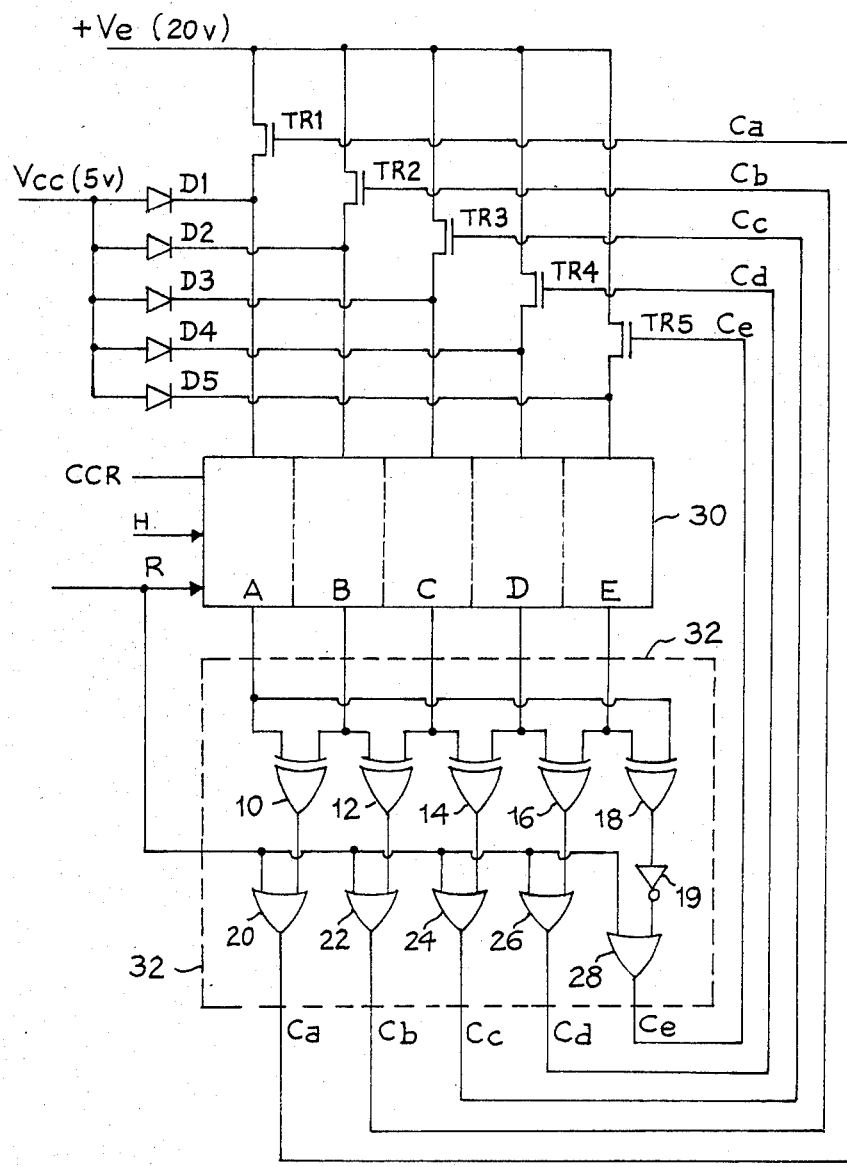
Figure 3:
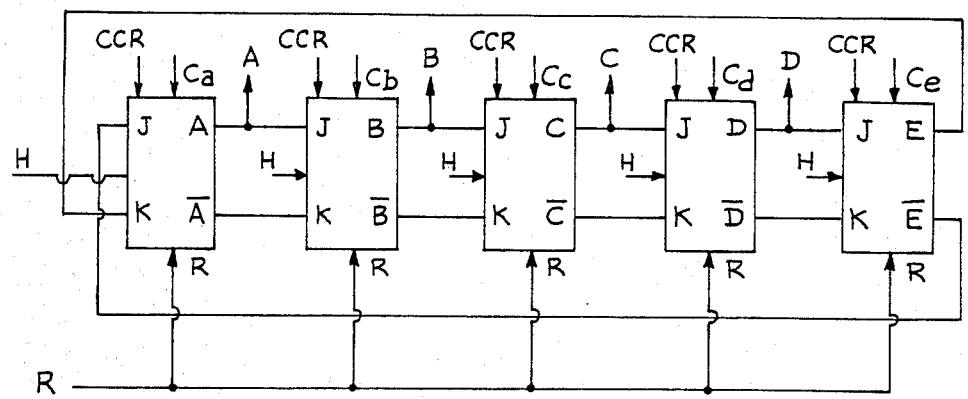
Figure 4:
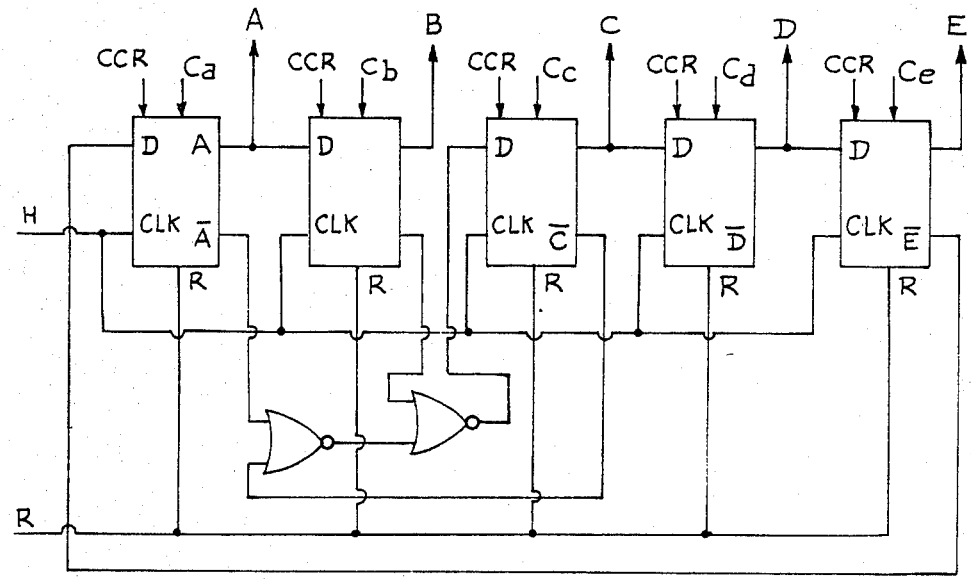

Other features and advantages of the invention will emerge from the following detailed description, with reference to the accompanying figures:

FIG. 1, already referred to, showing a bistable flipflop with non-volatile safeguard circuit, suitable for use in a counter;

FIG. 2, showing a counting unit according to this invention;

FIGS. 3 and 4, showing two ways of arranging flipflops to count according to the Johnson code.

It is quite usual to construct counting units of one decimal or hexadecimal figure, from four JK flipflops, or four D flipflops, and possibly a few gates. Flipflop outputs form the outputs of the counting unit, and the flipflops are connected with one another in a closed-loop layout, in such a way that the (binary) state of flipflop outputs cyclically represents the succession of digits 0 to 9, coded by a chosen code.

For example, a pure binary code may be used: if the outputs of the four flipflops are A, B, C and D in order of decreasing weights, the pure binary counting code from 0 to 15 is defined by the following successive states of the flipflops for each content of the counting unit:

|   | A | B | C | D |   | A | B | C | D |
|---|---|---|---|---|---|---|---|---|---|
| 0 | 0 | 0 | 0 | 0 | 8 | 1 | 0 | 0 | 0 |
| 1 | 0 | 0 | 0 | 1 | 9 | 1 | 0 | 0 | 1 |
| 2 | 0 | 0 | 1 | 0 | 10 | 1 | 0 | 1 | 0 |
| 3 | 0 | 0 | 1 | 1 | 11 | 1 | 0 | 1 | 1 |
| 4 | 0 | 1 | 0 | 0 | 12 | 1 | 1 | 0 | 0 |
| 5 | 0 | 1 | 0 | 1 | 13 | 1 | 1 | 0 | 1 |
| 6 | 0 | 1 | 1 | 0 | 14 | 1 | 1 | 1 | 0 |
| 7 | 0 | 1 | 1 | 1 | 15 | 1 | 1 | 1 | 1 |
|   |   |   |   |   | (16) | 0 | 0 | 0 | 0 |

For decimal counting (0 to 9) in BCD, flipflop outputs return to 0 at the tenth counting pulse:

|   | A | B | C | D |
|---|---|---|---|---|
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| (10) | 0 | 0 | 0 | 0 |

For these two very common codes, it can be seen that the outputs of the last flipflop (D output) change state at every incrementation. In order to safeguard the contents of the counter after each such incrementation, in a non-volatile way, the contents of the last flipflop would have to be rewritten every time.

This invention proposes the use of a different counting code (therefore resulting in a different flipflop arrangement), which is seldom used, because it requires five flipflops instead of four for decimal counting (0 to 9), and eight instead of four for hexadecimal counting (0 to 15).

For decimal counting, this code is as follows (the five flipflop outputs being identified as A, B, C, D and E):

|   | A | B | C | D | E |
|---|---|---|---|---|---|
| 0 | 0 | 0 | 0 | 0 | 0 |
| 1 | 1 | 0 | 0 | 0 | 0 |
| 2 | 1 | 1 | 0 | 0 | 0 |
| 3 | 1 | 1 | 1 | 0 | 0 |
| 4 | 1 | 1 | 1 | 1 | 0 |
| 5 | 1 | 1 | 1 | 1 | 1 |
| 6 | 0 | 1 | 1 | 1 | 1 |
| 7 | 0 | 0 | 1 | 1 | 1 |
| 8 | 0 | 0 | 0 | 1 | 1 |
| 9 | 0 | 0 | 0 | 0 | 1 |
| (10) | 0 | 0 | 0 | 0 | 0 |

This is the Johnson code, its usual advantage being the fact that one moves from one number to the number immediately following by changing a single bit (and therefore a single flipflop output), and that this change takes place in turn from one flipflop to the next (in contrast to the Gray code, for example, in which a single bit changes at each incrementation, but is not taken in turn from each flipflop). The result is a particularly simple method of decoding, to restore decimal date on counter contents.

However, the Johnson code is chosen here for a different reason, over and above the simplicity of decoding, and which is that each bit changes only twice during a complete counting cycle from 0 to 10 (the same could be true in hexadecimal coding with eight flipflops the codewriting algorithm being the same as in decimal coding).

Accordingly, the flipflop with output A changes status only when the counter changes from 0 to 1 or from 5 to 6; similarly, the flipflop with output B changes status only when the counter changes from 1 to 2 or from 6 to 7.

The result is not only that the contents of the counter can be safeguarded by performing a writing stage for a single flipflop after each incrementation (this could be achieved with a Gray code), but also that safeguarding of any one flipflop is needed only twice per cycle; finally, selection of the flipflop whose state is to be safeguarded (because it has changed) can be selected with a very simple combinative logic circuit, which can be defined with the help of the truth table below, where $C_a$, $C_b$, $C_c$, $C_d$ and $C_e$ are logic control signals indicating for each flipflop respectively whether safeguard is needed; e.g.

$C_a = 1$ for counter content equal to 1 or 6, and
$C_a = 0$ for all other contents;
$C_b = 1$ for content equal to 2 or 7, and
$C_b = 0$ for all other contents.

Consequently, $C_a$, $C_b$, $C_c$, $C_d$ and $C_e$ represent safeguard control signals for each flipflop.

|   | A | B | C | D | E | Ca | Cb | Cc | Cd | Ce |
|---|---|---|---|---|---|----|----|----|----|----|
| 0 | 0 | 0 | 0 | 0 | 0 | —  | —  | —  | —  | —  |
| 1 | 1 | 0 | 0 | 0 | 0 | 1  | 0  | 0  | 0  | 0  |
| 2 | 1 | 1 | 0 | 0 | 0 | 0  | 1  | 0  | 0  | 0  |
| 3 | 1 | 1 | 1 | 0 | 0 | 0  | 0  | 1  | 0  | 0  |
| 4 | 1 | 1 | 1 | 1 | 0 | 0  | 0  | 0  | 1  | 0  |
| 5 | 1 | 1 | 1 | 1 | 1 | 0  | 0  | 0  | 0  | 1  |

-continued

| | A | B | C | D | E | Ca | Cb | Cc | Cd | Ce |
|---|---|---|---|---|---|---|---|---|---|---|
| 6 | 0 | 1 | 1 | 1 | 1 | 1 | 0 | 0 | 0 | 0 |
| 7 | 0 | 0 | 1 | 1 | 1 | 0 | 1 | 0 | 0 | 0 |
| 8 | 0 | 0 | 0 | 1 | 1 | 0 | 0 | 1 | 0 | 0 |
| 9 | 0 | 0 | 0 | 0 | 1 | 0 | 0 | 0 | 1 | 0 |
| (10) | 0 | 0 | 0 | 0 | 0 | 0 | 0 | 0 | 0 | 1 |

The logic circuit used to generate safeguard instructions for each flipflop receives as its inputs flipflop outputs A, B, C, D and E, and it possesses five outputs $C_a$, $C_b$, $C_c$, $C_d$ and $C_e$. This circuit, which is represented by the dotted block 32 outlined with a broken line in FIG. 2, is deduced from the truth table above;

$C_a$ is formed basically by an anticoincidence circuit receiving A and B (OR-exclusive gate 10);

$C_b$ by an anticoincidence circuit receiving B and C (OR-exclusive gate 12);

$C_c$ by an anticoincidence circuit receiving C and D (OR-exclusive gate 14);

$C_d$ by an anticoincidence circuit receiving D and E (OR-exclusive 16); and $C_e$ by an anticoincidence circuit receiving E and A (OR-exclusive gate 18 followed by a reverser 19).

It is also desirable to safeguard the contents of the counter in the event of clearance and, so that such safeguarding will apply to all flipflops irrespective of the previous state of the counter, simple OR gates 20, 22, 24, 26 and 28 are placed after the coincidence and anticoincidence circuit outputs. One input of each of these gates receives the output from one such circuit, and the other receives the general clearance signal R. This ensures systematic safeguarding of the contents 00000 of the counter, when such contents are due to the signal R. On the other hand, safeguarding is provided only for the last flipflop (output E), when clearance to 00000 results from incrementation from 9 (00001).

A whole counting decade as proposed in this invention, and as shown in FIG. 2, comprising basically an actual counting unit 30 and a selection logic circuit 32, represented by the block outlined with a broken line, functions as follows.

A counting input H is shown, together with a general flipflop clearance input R, and a repositioning signal input CCR.

A supply voltage $V_{cc}$, such as 5 volts, is normally applied to each flipflop, but a higher writing voltage $V_e$, such as 20 volts, may be applied selectively to each flipflop, instead of the supply voltage $V_{cc}$, by means of individual MOS transistors $TR_1$ to $TR_5$, each controlled by safeguard control signals $C_a$, $C_b$, $C_c$, $C_d$ and $C_e$, respectively. The bases of these transistors correspond to the safeguard signal input $C_s$ in FIG. 1.

These signals are delivered by the five outputs of the selection logic circuit 32 already described.

Diodes $D_1$ to $D_5$ are used to prevent transmission of the writing voltage $V_e$ to the supply voltage $V_{cc}$, when a transistor $TR_1$ to $TR_5$ is in a conducting state.

Transistors $TR_1$ to $TR_5$ and diodes are the essential components of the selective activation system for memorization of the state of each flipflop. The resetting signal CCR must be at 0 volt while the writing voltage $V_e$ is being applied, the duration of such application being confined to 10 to 100 milliseconds, for example.

FIG. 3 shows a specimen connection of the five JK flipflops of a counting decade, in order to obtain flipflop outputs A, B, C, D and E, representing the number of incrementations of the decade, in accordance with the Johnson code. The flipflops are directly cascade-connected with one another, but the final flipflop outputs are crossed before being returned to the first flipflop inputs. Voltages $V_{cc}$ and $V_e$ are not shown, nor is the selection logic circuit 32, which, for the purposes of this invention, has to be added, to produce $C_a$, $C_b$, $C_c$, $C_d$ and $C_e$ from A, B, C, D and E.

FIG. 4 shows another specimen counting decade, using D instead of JK flipflops. The second and third flipflops are not directly cascade-connected, but two NOT-OR gates are used to trip the third flipflop from the states of the first, second and third; furthermore, the first flipflop is tripped by the complementary output E of the fifth flipflop. Other flipflops are directly cascade-connected.

As in FIG. 3, voltage supply lines and selection circuit are not shown.

The invention is not limited to the embodiments shown and described herein; many variants and modifications may be envisaged by those skilled in the art, without departing from the spirit and scope of the invention as defined in the appended claims.

What is claimed is:

1. A non-volatile counting unit, the contents of which are stored in a non-volatile memory after every count incrementation signal applied to an input of said counting unit, and which comprises several flipflops, the outputs of which represent the contents of the counting unit in binary form, wherein said flipflops are connected with one another to provide a representation of the decimal contents of said counting unit by the logic state of said several flipflops, in accordance with a code in which no bit changes more than twice in the course of a complete counting cycle, and wherein are provided selective activating means for non-volatile memorization of said flipflop logic states, and a selection logic circuit connected to said activation means, to prohibit activation of memorization of the state of flipflops that have not changed logic state after an incrementation of the counting unit, and to enable activation of memorization of the state of flipflops that have changed logic state after such incrementation.

2. A counting unit as defined in claim 1, comprising five flipflops, wherein a Johnson code is used, in which the state of the five flipflops corresponds to a decimal content of the counting unit, from 0 to 9.

3. A counting unit as defined in either of claims 1 or 2, wherein each flipflop comprises at least one MNOS transistor, or a floating-gate MOS transistor, forming a non-volatile store, wherein said activating means is capable of applying to said MNOS transistor a writing voltage that is higher than the normal operating voltage of the flipflop, and that the selection logic circuit can enable or prohibit transmission of the writing voltage to individual ones of said several flipflops.

4. A counting unit as defined in claim 1 or 2, wherein the selection logic circuit receives the flipflop outputs as its inputs.

5. A counting unit as defined in claim 4, wherein the selection logic circuit also receives a counter-clearance signal as one of its inputs.

6. A counting unit as defined in claim 1 or 2, wherein said selection logic circuit comprises:

a coincidence circuit receiving the outputs of two flipflops, to deliver an enabling signal to activate memorization of the state of one of said two flipflops;

four anticoincidence circuits, each of which receives the outputs of two successive flipflops, to deliver an enabling signal to activate memorization of the state of a respective one of said two successive flipflops.

7. A counting unit as defined in claim 6, wherein the selection logic circuit further comprises OR gates, each of which receives the enabling signal delivered by the coincidence or anticoincidence circuits at one input, and a general counting unit clearance signal at the other, to enable non-volatile memorization of flipflops on forced clearance of the counting unit.

8. A counting unit as defined in claim 1 or 2, wherein said activating means comprise switches controlled by the selection logic circuit, to connect a writing voltage source to each flipflop.

* * * * *